United States Patent [19]

Fletcher et al.

[11] 4,297,177

[45] Oct. 27, 1981

[54] METHOD AND COMPOSITION FOR ELECTRODEPOSITING PALLADIUM/NICKEL ALLOYS

[75] Inventors: Augustus Fletcher, Bristol; William L. Moriarty, South Meriden, both of Conn.

[73] Assignee: American Chemical & Refining Company Incorporated, Waterbury, Conn.

[21] Appl. No.: 188,977

[22] Filed: Sep. 19, 1980

[51] Int. Cl.³ .............................................. C25D 3/56
[52] U.S. Cl. .................................................. 204/43 N
[58] Field of Search ............................. 204/43 N, 123

[56] References Cited

U.S. PATENT DOCUMENTS

| | | | |
|---|---|---|---|
| 1,981,715 | 11/1934 | Atkinson | 204/43 |
| 2,452,308 | 10/1948 | Lambros | 204/47 |
| 3,580,820 | 5/1971 | Yamamura et al. | 204/43 N |
| 3,677,909 | 7/1972 | Yamamura et al. | 204/43 N |
| 3,677,912 | 7/1972 | Passal | 204/49 |
| 3,925,170 | 12/1975 | Skomoroski | 204/43 N |
| 3,933,602 | 1/1976 | Henzi et al. | 204/44 |
| 3,980,531 | 9/1976 | Ludwig et al. | 204/43 R |

FOREIGN PATENT DOCUMENTS

| | | |
|---|---|---|
| 45-8769 | 3/1970 | Japan . |
| 46-25604 | 7/1971 | Japan . |
| 46-25605 | 7/1971 | Japan . |
| 46-25606 | 7/1971 | Japan . |
| 46-25607 | 7/1971 | Japan . |
| 958685 | 5/1964 | United Kingdom . |
| 212692 | 2/1968 | U.S.S.R. . |

*Primary Examiner*—G. L. Kaplan

[57] ABSTRACT

A novel bath is provided for producing bright and relatively stress free electrodeposits of palladium/nickel alloy upon a workpiece. The bath includes, in addition to palladium and nickel ions as ammino complexes, amounts of saccharin and 3-butyne-2-ol that are, respectively, effective to reduce internal stresses and to brighten the deposit.

8 Claims, No Drawings

---

METHOD AND COMPOSITION FOR ELECTRODEPOSITING PALLADIUM/NICKEL ALLOYS

BACKGROUND OF THE INVENTION

Because of the outstanding electrical characteristics, hardness, corrosion resistance, stability and other desirable properties exhibited by palladium, it is advantageously used as a plating for electrical connectors, printed circuits, and the like, as well as for numerous other industrial and commercial applications. As a substitute for gold and platinum, palladium represents a more economical alternative, both on a simple weight basis and also in terms of covering power, due to its lower density; nevertheless it is, of course, by no means inexpensive. Consequently, alloys of palladium, and (in the particular context of the present invention) specifically with nickel, have been used in certain applications in order to further reduce costs. Baths for electrodepositing palladium/nickel alloys are taught in the art, such as in Yamamura et al U.S. Pat. Nos. 3,580,820 and 3,677,909; earlier patents disclose the use of nickel in palladium electroplating baths, not only as an alloying metal but also as a colorant, for grain size refinement, and the like, as exemplified by U.S. Pat. Nos. 1,981,715 and 2,452,308, United Kingdom patent specification No. 958,685 and Japanese Pat. No. 8769.

Despite such earlier activity, the baths of the prior art are not found to be entirely satisfactory. In some instances, they are unstable and prone to rapid decomposition and deterioration; some are too inefficient for practical use, or operate effectively only at unduly elevated temperatures; and in certain cases the nature of the deposit produced from the bath may be deficient, as being dark and/or brittle (especially in thicker sections), or as lacking brightness or specularity.

A bath intended essentially for electrodeposition of palladium, but which may contain other codepositable metals as well, as disclosed and claimed in copending application Ser. No. 183,318, filed in the name of Robert M. Skomoroski on Sept. 2, 1980 and entitled "PALLADIUM ELECTROPLATING BATH", which application is of common assignment herewith. A unique feature of the invention of that application resides in the use of 3-butyne-2-ol as a brightener, thus avoiding any need for a metallic brightening agent. Despite the benefits to be derived therefrom, and from the inventions of the aforesaid prior art patents, still a demand exists for a stable electroplating bath that is capable of efficiently producing bright, smooth, uniform and relatively stress free deposits, which operates efficiently over a wide range of current density and under convenient conditions, including mild bath temperatures.

Accordingly, it is a primary object of the present invention to provide a novel, cyanide-free bath for electrodepositing alloys of palladium and nickel, which bath is operative over a broad range of current density and at ambient to low-elevated temperatures, to produce a deposit that is relatively bright, smooth, uniform and free of stress.

It is also an object of the invention to provide a novel method for the electrodeposition of palladium/nickel alloys having the foregoing characteristics, which method can be carried out over a broad range of current density and at ambient to low-elevated temperatures.

SUMMARY OF THE DISCLOSURE

It has now been found that certain of the foregoing and related objects of the invention are readily attained in an aqueous bath containing palladium and nickel ions substantially in the form of ammino complexes, and having a pH of 7 to 11. The components of the bath, expressed as gram moles per liter, are: 0.01 to 0.25 of palladium ion; 0.015 to 0.85 of nickel ion; 0.15 to 1.5 of a soluble electrolyte selected from the group consisting of alkali metal and ammonium sulfates, sulfamates, phosphates, nitrates, nitrites, and mixtures thereof; 0.005 to 0.15 of a saccharin or soluble saccharate stress reducer; $1.5 \times 10^{-4}$ to $10 \times 10^{-4}$ of 3-butyne-2-ol brightener; up to $6 \times 10^{-4}$ of cetyltrimethylammonium bromide; up to an effective amount of ammonium hydroxide; and water to volume.

In the preferred embodiments of the bath, the cetyltrimethylammonium bromide is present in an amount of at least $0.3 \times 10^{-4}$ gram mole per liter, and about 0.25 to 1.5 gram moles per liter of ammonium hydroxide is included. Most desirably, the concentrations of the several components of the bath will be (again in gram moles per liter): 0.05 to 0.15 of palladium ion, 0.05 to 0.5 of nickel ion, 0.25 to 0.75 of the electrolyte, 0.015 to 0.05 of the stress reducer, $3 \times 10^{-4}$ to $7 \times 10^{-4}$ of the brightener, and $0.5 \times 10^{-4}$ to $3 \times 10^{-4}$ of cetyltrimethylammonium bromide; ammonium sulfate is the most preferred electrolyte salt.

In more specific embodiments of the bath, the combination of ingredients consists essentially of 0.01 to 0.25 gram mole per liter of palladium ion, 0.015 to 0.85 gram mole per liter of nickel ion, 20 to 200 grams per liter of ammonium sulfate, 0.005 to 0.15 gram mole per liter of saccharin or soluble saccharate, 0.01 to 0.1 gram per liter of 3-butyne-2-ol, 0.01 to 0.2 gram per liter of cetyltrimethylammonium bromide, an effective amount of ammonium hydroxide, and water to volume. Preferably, such a bath will contain 2.0 to 50 grams per liter of palladosammine chloride to provide the palladium ion, 6.7 to 336 grams per liter of ammoniumnickelsulfate hexahydrate to provide the nickel ion, and about 10 to 50 grams per liter of ammonium hydroxide.

Other objects of the invention are attained in a method of electrodepositing palladium/nickel alloy upon a workpiece, wherein the steps comprise: (a) immersing a workpiece having an electrically conductive surface in an aqueous electroplating bath having a composition as previously described; (b) maintaining the temperature of the bath at about 22° to 60° Centigrade; (c) applying an electrical potential across the workpiece and an anode to provide a current density of about 0.05 to 25 amperes per square decimeter at the workpiece to effect electroplating of the desired thickness for the deposit; and (d) removing the electroplated workpiece from the bath. Plating is carried out with relative movement between the bath and workpiece, which preferably is achieved by agitation of both.

DETAILED DESCRIPTION OF THE PREFERRED EMBODIMENTS

As has been indicated hereinbefore, the compositions of the present invention essentially comprise an aqueous solution of ammino complexes of palladium and nickel ions, an electrolyte, a saccharin stress reducer, and a brightener comprised of 3-butyne-2-ol; generally ammonium hydroxide will be added, and cetyltrimethylammonium bromide is an especially desirable optional ingredient.

Considering initially the source of palladium ion, introduction may be made as any soluble compound having a non-interfering anion, such as palladous sulfate, palladous chloride, palladous nitrate, or as a palladium complex such as diamminepalladium nitrite, palladosammine chloride (dichlorodiamminepalladium) or tetraminepalladium chloride; palladosammine chloride is, however, preferred. The amount of palladium in the bath may broadly range from about 0.01 to 0.25 gram mole per liter, and is preferably within the range of 0.05 to 0.15 gram mole per liter.

Similarly, the nickel ion may be introduced as any suitable simple or complex salt, such as nickel sulfate, nickel chloride, ammoniumnickelsulfate hexahydrate, and the like; of the foregoing, the last-mentioned salt is particularly desirable. The amount of nickel in the bath may broadly range from about 0.015 to 0.85 gram mole per liter, with concentrations of from about 0.05 to 0.5 gram mole per liter being preferred.

The electrolyte may be provided by any one or mixture of alkali metal and ammonium sulfates, sulfamates, phosphates, nitrates and nitrites; however, ammonium sulfate is the preferred electrolyte. While it can be used in any effective concentration, generally at least 0.15 gram mole per liter will be the minimum amount present. The preferred amount of electrolyte is about 0.25 to 0.75 gram mole per liter, and generally the concentration in the bath will not exceed about 1.5 gram moles per liter.

Ammonium hydroxide is advantageously used to regulate the pH of the bath, and will usually be present in an amount of 0.25 to 1.5 gram moles per liter, calculated as ammonium hydroxide (exclusive of water). The same compound may, of course, be used to ensure the formation of the palladium and nickel ammino complexes. Most desirably, the ammonium hydroxide is added as a highly concentrated aqueous solution (e.g., 29 percent by weight) in order to minimize dilution, although less concentrated compositions may of course be employed, as long as the water introduced thereby is entered into the calculations as to concentration of the remaining ions.

In the event that it is desired to adjust the pH downwardly (i.e., to make it more acid), an acid having non-interfering anion should be employed. Most conveniently and desirably hydrochloric acid may be used, although nitric acid, sulfuric acid, sulfamic acid, and the like, and mixtures thereof, may be used to advantage in appropriate cases.

As has been indicated heretofore, the brightener employed in the present compositions is 3-butyne-2-ol, used in amounts of about $1.5 \times 10^{-4}$ to $10 \times 10^{-4}$, and preferably about $3 \times 10^{-4}$ to $7 \times 10^{-4}$, gram mole per liter. While it may be advantageous to use the 3-butyne-2-ol as the sole brightener for the system, it is to be understood that the bath may include other brighteners as well, such as ions of metals in appropriate circumstances.

An essential ingredient of the baths of the present invention is a saccharin compound, and either saccharin itself or (for greater solubility) a soluble salt thereof (normally sodium saccharate) will be used. Typically the amount of the saccharin constituent will be about 0.005 to 0.15 gram mole per liter, with the preferred quantity being in the range 0.015 to 0.05 gram mole per liter. It is to be noted that, although it is known in the art to use saccharin as a brightener in palladium/nickel alloy baths (see, i.e., the above-identified Yamamura et al. U.S. Pat. No. 3,677,909), there has heretofore been no suggestion for its use to reduce internal stresses in such a deposit produced using the 3-butyne-2-ol brightener. Its effectiveness in doing so in the bath and method of the present invention is demonstrated by specific examples that are set forth hereinbelow.

Cetyltrimethylammonium bromide is an optional but desirable additive to effectively eliminate any tendency for gas pitting in the palladium deposit. The amount of this additive should be closely controlled, since excessive amounts will produce undue foaming, and will thereby interfere with the plating operations. As a result, the maximum amount of CTAB that should be employed is about $6 \times 10^{-4}$ gram mole (or 0.2 gram) per liter, and preferably the concentration will be less than $3 \times 10^{-4}$ gram mole per liter; an amount of as little as $0.5 \times 10^{-4}$ gram mole per liter will usually suffice to produce advantageous results.

The pH of the bath is maintained within the range of 7 to 11, and preferably within the range of 8.5 to 9.5. As indicated hereinbefore, the value of pH may be adjusted as necessary, typically by the addition of ammonium hydroxide or by the use of a suitable acid providing a non-interfering anion.

The temperature of the bath should be within the range of 22° to 60° Centigrade, and preferably 35° to 45°. Generally, its density will be about 4° to 20°, and more commonly 5° to 15°, Baume. Agitation has been found to be necessary for the achievement of best results with the instant baths, and preferably movement of both the bath itself and also the workpiece will be effected. Filtration significantly promotes the production of pore-free adherent deposits, because of the profound effect that the presence of any solid contaminants can have, and is therefore a highly desirable practice. Standard filter cartridges of polypropylene or other filter media may advantageously be employed for continuous filtration.

Various anodes that are inert to the plating bath may be used, and will generally have a surface of noble metal, although carbon anodes may have limited utility. The preferred anodes are of platinum-clad tantalum, but gold-clad tantalum, platinum and palladium electrodes may all be employed effectively. The anode to cathode surface area ratio should be within the range of 1.0 to 5.0:1.0, and preferably a ratio of about 2.0:1.0 will be used. The baths of the invention are operable at current density values within the range of 0.05 to 25.0 amperes per square decimeter, but preferably they will be used at about 0.5 to 10.0 amperes per square decimeter.

Exemplary of the efficacy of the baths and methods of the present invention are the following specific examples:

EXAMPLE ONE

An aqueous bath is prepared by dissolving, in a sufficient volume of water to produce one liter, 50 grams of ammonium sulfate, 55 grams of ammoniumnickelsulfate hexahydrate [$NiSO_4(NH_4)_2SO_4 \cdot 6H_2O$], 45 milliliters of a 29 percent solution of ammonium hydroxide, 0.02 milliliter of 3-butyne-2-ol, and 5 grams of sodium saccharate. To the foregoing is added 16.3 grams of palladosammine chloride [$Pd(NH_3)_2Cl_2$] dissolved in 20 milliliters of 29 percent ammonium hydroxide and 50 milliliters of water. Deionized water is utilized in all instances, and stirring is employed as necessary to effect dissolution. The resultant solution has an electrometric pH of 8.89 and a density of 8.4° Baume.

Part A

Utilizing the solution at a temperature of 37.7° Centigrade, polished brass panels are electroplated in a Hull cell under various conditions, but with agitation of the bath in all instances. The results are set forth below in Table I, wherein current is expressed in amperes, time is in minutes, the range of brightness is in amperes per square decimeter, and efficiency is in milligrams of metal deposited per ampere minute:

TABLE ONE

| Current | Time | Bright Range | Efficiency |
|---------|------|--------------|------------|
| 0.5 | 2.0 | 0-2+ | 25.4 |
| 1.0 | 1.0 | 0-4+ | 25.5 |
| 2.0 | 0.5 | 0-8 | 23.9 |

Part B

Utilizing the bath of Part A (agitated, and at 37.7° Centigrade), one side of a polished brass panel measuring 1 inch×3 inches is plated at a current density of 1.0 ampere per square decimeter for a period of approximately two hours, so as to produce a thickness of about one mil. The brass substrate is dissolved to produce a foil of palladium/nickel alloy, which is fully integral and self-supporting. Upon analysis, it is found to contain 78.2 weight percent of palladium and 21.8 weight percent of nickel, to have a Knoop hardness of 518 (with a 25 gram indenting tool) and to have a density of 10.81 grams per cubic centimeter.

Part C

The same bath, but containing no saccharin, is used under comparable conditions to produce a one-mil deposit. Upon dissolution of the brass panel substrate, the deposit disintegrates, thus demonstrating the effectiveness of the saccharin in relieving internal stresses.

Part D

The bath of Part A is modified by adding thereto 0.0375 gram per liter of CTAB. When plating is carried out under the conditions indicated in Table One, efficiencies of 23.4, 25.7 and 24.7 milligrams per ampere minute are realized at applied currents of 0.5, 1.0 and 2.0 amperes, respectively. The deposits are slightly improved from those of Part A, by virtue of a reduction in the small amount of gas pitting than is evidenced thereby.

EXAMPLE TWO

Part A

A second bath embodying the invention is prepared by admixing the same ingredients utilized in the bath of Part A of Example One, but with amounts of the ammoniumnickelsulfate hexahydrate and ammonium hydroxide adjusted to 165 grams per liter and 135 milliliters per liter, respectively; the resultant solution has a pH of 9.2 and a density of 14.6° Baume. Again, Hull cell plating is effected with the bath agitated and at a temperature of 37.7° Centigrade, and under the same conditions of time and current specified in Table One, to produce the results set forth below in Table Two:

TABLE TWO

| Current | Time | Bright Range | Efficiency |
|---------|------|--------------|------------|
| 0.5 | 2.0 | 0-2+ | 23.4 |
| 1.0 | 1.0 | 0-4+ | 23.8 |
| 2.0 | 0.5 | 0-8+ | 23.5 |

Part B

The bath of Part A is used to plate a polished brass panel, and is subsequently dissolved to produce a foil, as described in Example One. The deposit is found to contain 59.9 weight percent of palladium and 40.1 weight percent of nickel, to have a Knoop hardness (determined with a 100 gram indenting tool) of 544, and to have a density of 10.66 grams per cubic centimeter.

Part C

Sodium saccharin is excluded from the bath of Part A hereof, without perceptible effect upon the range over which it operates to produce a bright deposit; however, the level of internal stress is again found to be significantly greater than in deposits produced from the bath of the foregoing part, such that disintegration occurs when the panel is etched away.

Part D

The addition of CTAB to the bath of Part A improves the deposit by minimizing gas pitting.

Thus, it can be seen that the present invention provides a stable bath for electrodepositing alloys of palladium/nickel, which deposits are bright, smooth, uniform and relatively stress free. The bath operates efficiently over a wide range of current density, and under convenient conditions, including mild temperatures.

Having thus described the invention, what is claimed is:

1. In an aqueous bath for producing bright and relatively stress-free electroplate of palladium/nickel alloy, the combination, expressed as gram moles per liter, comprising: 0.01 to 0.25 of palladium ion; 0.015 to 0.85 of nickel ion; 0.15 to 1.5 of a soluble electrolyte selected from the group consisting of alkali metal and ammonium sulfates, sulfamates, phosphates, nitrates, nitrites, and mixtures thereof; 0.005 to 0.15 of a saccharin or soluble saccharate stress reducer; $1.5 \times 10^{-4}$ to $10 \times 10^{-4}$ of 3-butyne-2-ol brightener; up to $6 \times 10^{-4}$ of cetyltrimethylammonium bromide; up to an effective amount of ammonium hydroxide; and water to volume, said palladium and nickel ions being substantially in the form of ammino complexes, and said bath having a pH of 7 to 11, with said amount of ammonium hydroxide being effective to insure said complexed state of said ions and said pH value of said bath.

2. The bath of claim 1 wherein said cetyltrimethylammonium bromide is present in an amount of at least about $0.3 \times 10^{-4}$ gram mole per liter, and wherein said bath includes about 0.25 to 1.5 gram moles per liter of ammonium hydroxide.

3. The bath of claim 2 wherein the amounts of the components are, in gram moles per liter, 0.05 to 0.15 of palladium ion, 0.05 to 0.5 of nickel ion, 0.25 to 0.75 of said electrolyte, 0.015 to 0.05 of said stress reducer, $3 \times 10^{-4}$ to $7 \times 10^{-4}$ of said brightener, and $0.5 \times 10^{-4}$ of said cetyltrimethylammonium bromide.

4. The bath of claim 1 wherein said electrolyte is ammonium sulfate.

5. In an aqueous bath for producing bright and relatively stress-free electroplate of palladium/nickel alloy, the combination consisting essentially of: 0.01 to 0.25 gram mole per liter of palladium ion; 0.015 to 0.85 gram mole per liter of nickel ion; 20 to 200 grams per liter of ammonium sulfate; 0.005 to 0.15 gram mole per liter of a saccharin or soluble saccharate stress reducer; 0.01 to 0.2 gram per liter of cetyltrimethylammonium bromide; an effective amount of ammonium hydroxide; and water to volume, said palladium and nickel ions being substantially in the form of ammino complexes, and said bath having a pH of 7 to 11, with said amount of ammonium hydroxide being effective to insure said complexed state of said ions and said pH value of said bath.

6. The bath of claim 5 wherein said bath contains 2.0 to 50 grams per liter of palladosamine chloride to provide said palladium ion, wherein said bath includes 6.7 to 336 grams per liter of ammoniumnickelsulfate hexahydrate to provide said nickel ion, and wherein said bath contains about 10 to 50 grams per liter of ammonium hydroxide.

7. In a method of electroplating palladium/nickel alloy deposits upon a workpiece, the steps comprising: (a) immersing a workpiece having an electrically conductive surface in the aqueous bath of either of claims 1 and 5; (b) maintaining the temperature of said bath at about 22° to 60° Centigrade; (c) applying an electrical potential across said workpiece and an anode to provide a current density of about 0.05 to 25 amperes per square decimeter at said workpiece, while producing relative movement of said bath and workpiece, to effect electroplating of the desired thickness for the deposit; and (d) removing the electroplated workpiece from said bath.

8. The method of claim 7 wherein said relative movement is achieved by agitation of both said bath and also of said workpiece.

* * * * *

UNITED STATES PATENT AND TRADEMARK OFFICE
CERTIFICATE OF CORRECTION

PATENT NO. : 4,297,177
DATED : October 27, 1981
INVENTOR(S) : AUGUSTUS FLETCHER and WILLIAM L. MORIARTY It is certified that error appears in the above–identified patent and that said Letters Patent are hereby corrected as shown below:

Column 6, line 65, after "$0.5 \times 10^{-4}$" insert -- to $3 \times 10^{-4}$ --

Signed and Sealed this

Sixteenth Day of March 1982

[SEAL]

Attest:

GERALD J. MOSSINGHOFF

Attesting Officer     Commissioner of Patents and Trademarks